United States Patent
Robert et al.

(10) Patent No.: US 10,107,343 B2
(45) Date of Patent: Oct. 23, 2018

(54) THERMOELECTRIC ENERGY RECOVERY FROM A BRAKE SYSTEM

(71) Applicant: FORD GLOBAL TECHNOLOGIES, LLC, Dearborn, MI (US)

(72) Inventors: Brian Joseph Robert, Saint Clair Shores, MI (US); Kent Snyder, Dearborn, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 393 days.

(21) Appl. No.: 14/602,393

(22) Filed: Jan. 22, 2015

(65) Prior Publication Data

US 2016/0215833 A1    Jul. 28, 2016

(51) Int. Cl.
*F16D 61/00* (2006.01)
*H01L 35/32* (2006.01)
*F16D 55/225* (2006.01)

(52) U.S. Cl.
CPC .......... *F16D 61/00* (2013.01); *F16D 55/225* (2013.01); *H01L 35/32* (2013.01)

(58) Field of Classification Search
CPC ........ F16D 55/225; F16D 61/00; F16D 65/78; F16D 2127/00; F16D 2129/00; F16D 2129/06; F16D 2129/12; F16D 2500/3121; F16D 2500/3122; H01L 35/32
See application file for complete search history.

(56) References Cited

U.S. PATENT DOCUMENTS

| | | | |
|---|---|---|---|
| 6,302,243 B1 * | 10/2001 | Ruiz | F16D 55/228 188/73.1 |
| 8,552,283 B2 | 10/2013 | Dede et al. | |
| 8,770,352 B2 | 7/2014 | Horio et al. | |
| 8,803,484 B2 | 8/2014 | Iizuka et al. | |
| 2005/0145447 A1 * | 7/2005 | Nowak | F16D 61/00 188/71.6 |
| 2009/0151440 A1 | 6/2009 | Collonge et al. | |
| 2010/0269878 A1 | 10/2010 | Kuhlbach | |
| 2011/0272230 A1 * | 11/2011 | Sekiya | B60T 1/10 188/70 R |
| 2012/0000737 A1 * | 1/2012 | Horio | B60T 1/10 188/71.6 |
| 2014/0229047 A1 | 8/2014 | Kees et al. | |

FOREIGN PATENT DOCUMENTS

| | | | |
|---|---|---|---|
| DE | 102010050284 A1 * | 5/2012 | |
| JP | 2009269469 A * | 11/2009 | |
| WO | 2015041231 | 4/2012 | |

OTHER PUBLICATIONS

Drawing and abstract of KR-2008101526-A; Nov. 2008.*
Machine English Translation of KR-2008101526.*
(Continued)

*Primary Examiner* — Melody M Burch
(74) *Attorney, Agent, or Firm* — Carlson, Gaskey & Olds, P.C.

(57) ABSTRACT

An exemplary brake assembly includes a brake pad, an actuator that selectively moves the brake pad to contact a rotor, and a thermoelectric generator device housed outside the brake pad. The thermoelectric generator device generates power in response to a temperature difference within the brake assembly.

19 Claims, 5 Drawing Sheets

(56) References Cited

OTHER PUBLICATIONS

English Machine Translation of JP-2009269469.*
Bell, Lon E., Cooling, Heating, Generating Power, and Recovering Waste Heat with Thermoelectric Systems, Science Magazine, Sep. 12, 2008, pp. 1457-1461.
Riffat, S.B. and Xiaoli MA, Thermoelectrics: a review of present and potential applications, Aug. 23, 2002, Institute of Building Technology, School of Built Environment, The University of Nottingham, University Park, Nottingham, United Kingdom, published by Elsevier Science Ltd. in 2003.
Garnica, Jaime, Chinga, Raul A., and Jenshan Lin, Wireless Power Transmission: From Far Field to Near Field, Proceedings of the IEEE, Jun. 6, 2013, pp. 1321-1331, vol. 101, No. 6.
Yazawa, Kazuaki and Ali Shakouri, Cost-efficiency Trade-off and the Design of Thermoelectric Power Generators, Environmental Science & Technology, Jun. 23, 2011, pp. A-F.
Leblanc, Saniya, Yee, Shannon K., Scullin, Matthew L., Dames, Chris, and Kenneth E. Goodson, Material and manufacturing cost considerations for thermoelectrics, Renewable and Sustainable Energy Reviews, Dec. 18, 2013, pp. 313-327, published by Elsevier Science Ltd. in 2014.
Liu, Weiming and Jerome L. Pfeifer Introduction to Brake Noise & Vibration, Honeywell Friction Materials.
Sivinski, R., Evaluation of the effectiveness of TPMS in proper tire pressure maintenance, Nov. 2012, Report No. DOT HS 811 681, Washington, DC: National Highway Traffic Safety Administration.
Lau, Paul G. and Richard J. Buist, Calculation of Thermoelectric Power Generation Performance Using Finite Element Analysis, Thermoelectrics, Aug. 1997, published by the IEEE.
Szybist, Jim and Jim Parks, Enhancing Heat Recovery for Thermoelectric Devices, Sep. 29, 2010, United States Department of Energy, Oak Ridge National Laboratory.
Neys, Adriaan, In-Vehicle Brake System Temperature Model, 2012, Report No. 2012:38, pp. 1-82, Department of Applied Mechanics at Chalmers University of Technology, Göteborg, Sweden.
Emery, Ashley F., Kumar, P., and Joseph C. Firey, Experimental Study of Automotive Brake System Temperatures, Jul. 1997, pp. 1-34, prepared for Washington State Transportation Commission, Seattle, WA.

* cited by examiner

THERMOELECTRIC ENERGY RECOVERY FROM A BRAKE SYSTEM

TECHNICAL FIELD

This disclosure is directed toward thermoelectric energy recovery and, more particularly, to thermoelectric energy recovery from relatively low wear components of a brake system.

BACKGROUND

Braking a rotating component, such as a vehicle wheel, can generate heat. Some known systems convert heat into electrical energy using thermoelectric generators. Incorporating thermoelectric generators into braking systems can be challenging. Exposure to harsh ambient conditions common within braking systems can, for example, damage the thermoelectric generators or interfere with operation of the thermoelectric generators.

SUMMARY

A brake assembly according to an exemplary aspect of the present disclosure includes, among other things, a brake pad, an actuator that selectively moves the brake pad to contact a rotor, and a thermoelectric generator device housed outside the brake pad. The thermoelectric generator device generates power in response to a temperature difference within the brake assembly.

In a further non-limiting embodiment of the foregoing assembly, the temperature difference is a temperature difference between a portion of the actuator and ambient air.

In a further non-limiting embodiment of any of the foregoing assemblies, the temperature difference is a temperature difference between a portion of the actuator and a brake fluid.

In a further non-limiting embodiment of any of the foregoing assemblies, the thermoelectric generator device is secured to the actuator.

In a further non-limiting embodiment of any of the foregoing assemblies, the actuator is a caliper.

In a further non-limiting embodiment of any of the foregoing assemblies, the brake pad comprises a pad body secured to a pad backing plate.

In a further non-limiting embodiment of any of the foregoing assemblies, the thermoelectric generator device comprises an integrated thermoelectric array.

A vehicle includes, among other things, the brake assembly of any of the foregoing assemblies, and further includes a wheel that is rotatable together with the rotor.

In a further non-limiting embodiment of the foregoing vehicle, the vehicle includes a tire pressure monitoring system at least partially powered by power from the thermoelectric generator device.

A brake assembly according to an exemplary aspect of the present disclosure includes, among other things, a brake pad, an actuator that selectively moves the brake pad to contact a rotor, and a thermoelectric generator device that generates power in response to a temperature difference between a first area and a second area. The thermoelectric generator is housed outside of the brake pad.

In a further non-limiting embodiment of the foregoing assembly, the first area and the second area are both areas of the actuator.

In a further non-limiting embodiment of any of the foregoing assemblies, the first area is an area of the actuator, and the second area is a fluid.

In a further non-limiting embodiment of any of the foregoing assemblies, the first area is an area of the actuator and the second area is a backing plate of the brake pad.

In a further non-limiting embodiment of any of the foregoing assemblies, the brake pad is a relatively high wear component, and the thermoelectric generator device is secured to a relatively low wear component.

In a further non-limiting embodiment of any of the foregoing assemblies, the first area is an area of a backing plate of the actuator and the second area is ambient air.

A power generating method according to an exemplary aspect of the present disclosure includes, among other things, selectively moving a brake pad against a rotor using an actuator, and generating power using a thermoelectric generator device within a brake system and spaced from the brake pad.

In a further non-limiting embodiment of the foregoing method, the method includes powering a tire pressure monitoring system with the power.

In a further non-limiting embodiment of any of the foregoing methods, the method includes charging a battery of a vehicle with the power.

In a further non-limiting embodiment of any of the foregoing methods, the thermoelectric generator device generates power via the Seebeck effect.

In a further non-limiting embodiment of any of the foregoing methods, the actuator is a caliper, and the thermoelectric generator device generates power using a temperature difference between a first, relatively hot portion of the caliper and a second, relatively cold portion of the caliper.

In a further non-limiting embodiment of any of the foregoing methods, the thermoelectric generator device generates power using a temperature difference between a portion of the actuator and a brake fluid.

In a further non-limiting embodiment of any of the foregoing methods, the brake pad comprises a pad body secured to a pad backing plate. The pad body and the backing plate are relatively high wear components. The thermoelectric generator device is secured to a relatively low wear component of the brake system.

The embodiments, examples and alternatives of the preceding paragraphs, the claims, or the following figures and description, including any of their various aspects or respective individual features, may be taken independently or in any combination. Features described in connection with one embodiment are applicable to all embodiments, unless such features are incompatible.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure relates generally to recovering power from heat within a braking assembly. The braking assembly is shown as a friction brake used in connection with a rotatable wheel of a vehicle, but could apply to other types of braking assemblies. Other types of braking assemblies include friction brakes used to brake rotatable components in light rail assemblies, aerospace assemblies, forklift assemblies, wind turbine assemblies, etc.

Figure 1:
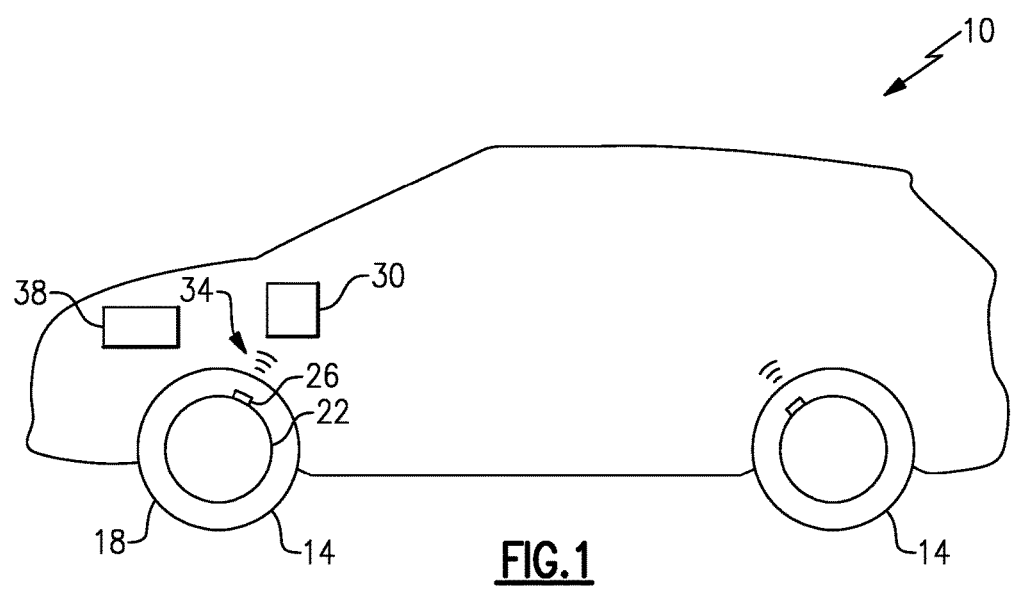
FIG. 1 shows a partial schematic view of an electrified vehicle.

Referring to FIG. 1, an example vehicle 10 is an electrified vehicle including a plurality of rotatable wheels 14. Generally, electrified vehicles differ from conventional motor vehicles because electrified vehicles can be selectively driven using one or more battery-powered electric machines. Conventional motor vehicles, by contrast, are typically driven exclusively by an internal combustion engine.

The wheels 14 include a tire 18 mounted to a rim 22. The tire 18 is an inflatable, pneumatic tire.

A tire pressure monitoring sensor 26 monitors air pressure inside the tire 18. A controller 30 receives wireless signals 34 from the tire pressure monitoring sensor 26 about the air pressure inside the tire 18. In response to the wireless signals 34, the controller 30 can initiate an alert if internal pressure falls below a threshold value. The tire pressure monitoring sensors 26 can further comprise a capacitor and control circuit, and a nearfield receiver to communicate wirelessly with the controller 30.

In other examples, a wired connection couples the tire pressure monitoring sensors 26 to the controller 30. In such examples, the tire pressure monitoring sensors 26 may not include a nearfield receiver.

The tire pressure monitoring sensors 26 can include a battery that powers the tire pressure monitoring sensors 26. The tire pressure monitoring sensors 26 can also, or instead, be powered by an accessory battery 38 of the vehicle 10.

In some examples, the tire pressure monitoring sensors 26 comprise wheel speed sensors that are wired directly to the controller 30. In response to a rotational speed of one of the wheels 14, the controller 30 may calculate that the wheel 14 has an internal pressure that is below a threshold value. The controller 30 can initiate an alert in response to this calculation.

The example tire pressure monitoring sensors 26 are shown in connection with the wheels 14 of the vehicle 10, but could be used in other wheels, such as trailer wheels.

Figure 2:
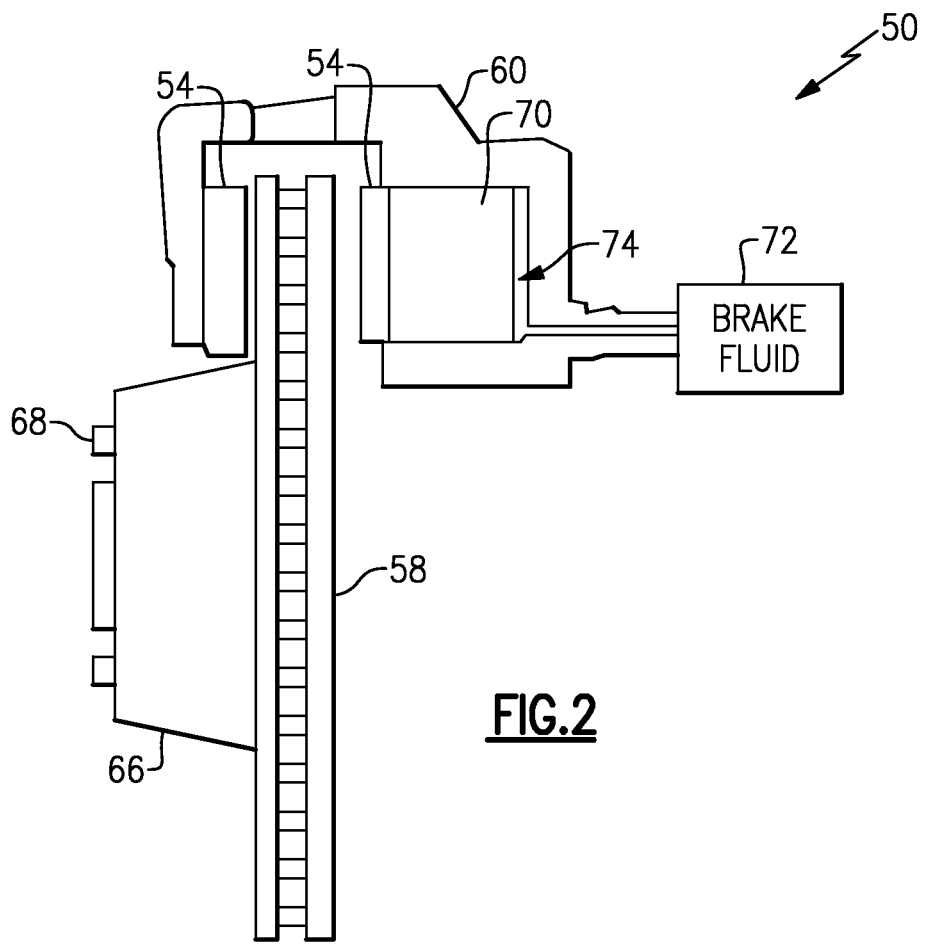
FIG. 2 shows an end view of a braking assembly used in connection with the vehicle of FIG. 1.
Figure 3:
FIG. 3 shows a side view of a brake pad from the braking assembly of FIG. 2.
Figure 4:
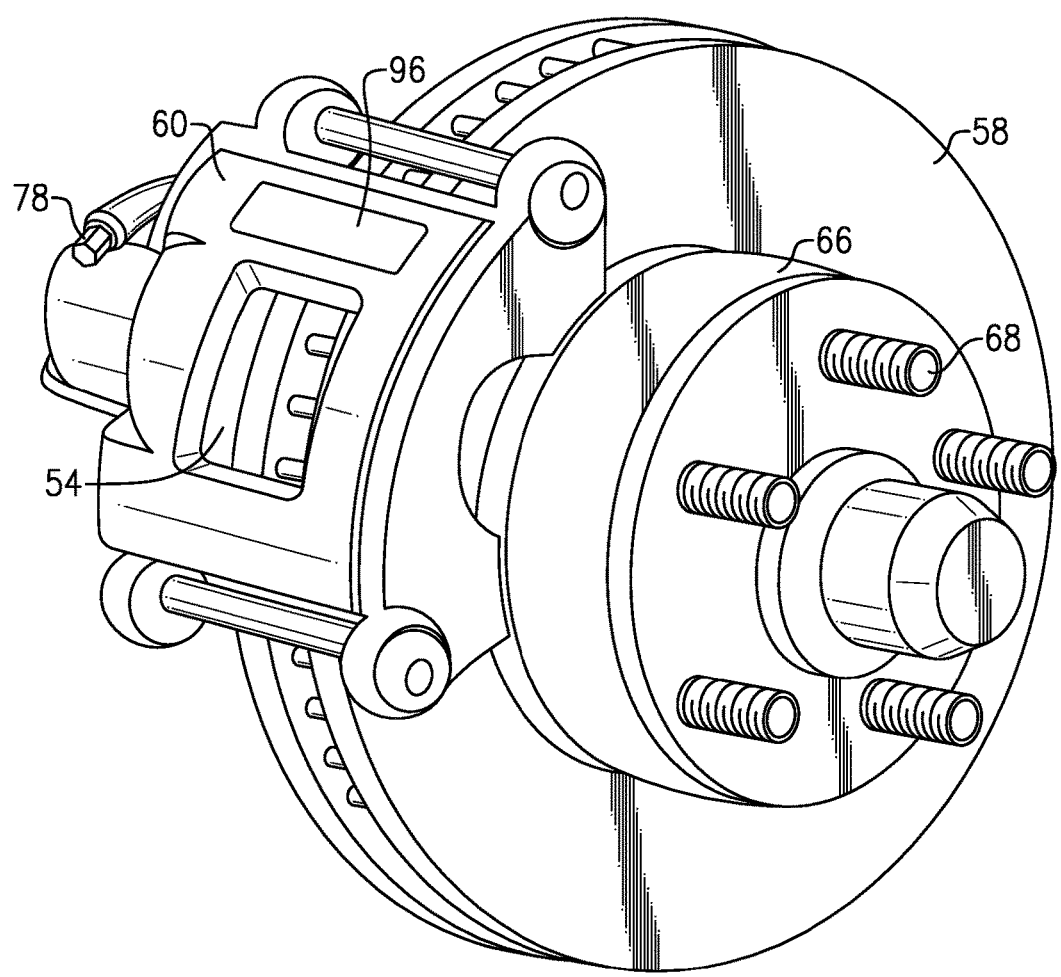
FIG. 4 shows a perspective view of the braking assembly of FIG. 2.

Referring now to FIGS. 2 to 4 with continuing reference to FIG. 1, the vehicle 10 includes a brake assembly 50 used to slow or stop rotation of the wheels 10. The brake assembly 50 includes brake pads 54, a rotor 58, and an actuator 60.

The rim 22 of the wheel 14 mounts to a hub 66 via mounting studs 68. The hub 66, the rotor 58, and the wheel 14 rotate together. The actuator 60 selectively moves the brake pad 54 into contact with the rotor 58. Friction between the brake pad 54 and the rotor 58 limits rotation of the wheel 14, which slows the vehicle 10. The brake pad 54 is in a braking position when contacting the rotor 58, and a free position when not contacting the rotor 58.

The brake pad 54 includes a friction material 62 bonded to a backing plate 64. The friction material can be fully-metallic, semi-metallic, or a non-metallic, such as ceramic. The backing plate 64 of the brake pad 54 is typically a metallic material, such as steel.

In this example, the actuator 60 is a caliper and includes a piston 70 within a piston housing portion of the actuator 60. The actuator 60 is cast in this example, but may be manufactured utilizing techniques other than casting. The actuator 60 is, generally, the assembly that moves the friction material 62 and the backing plate 64 of the brake pad 54 between the braking position and the free position. Although described as a caliper including the piston 70, the actuator 60 may have many forms.

Brake fluid from a brake fluid supply 72 is selectively moved into an area 74 to move the piston 70 into contact with the rotor 58. Sufficient movement of the piston 70 clamps the brake pads 54 against opposing sides of the rotor 58 to slow or stop the wheels 14. The brake assembly 50 further includes a bleed valve 78 to facilitate removing air within the brake fluid.

As can be appreciated, the brake pad 54 is a relatively high wear component when compared to the actuator 60. High wear components are typically considered components requiring periodic replacement at scheduled maintenance intervals. Brake pads, such as the brake pad 54, are typically replaced at scheduled maintenance intervals. Actuators, in contrast to brake pads, are not typically replaced at scheduled maintenance intervals. Other example high wear components can include brake rotors, tires, spark plugs, and oil filters. Example low wear components can include the actuator 60, sensors, electrical relays, and windshields.

In some examples, high wear components, such as the brake pad 54, are components that are not designed to last through the warrantied life of the vehicle 10. The actuator 60, a low wear component in contrast to the brake pad 54, is designed to last through the warrantied life of the vehicle 10.

Contact between the brake pads 54 and the rotor 58 generates heat, which causes some portions of the brake assembly 50 to heat relative to other portions of the brake assembly 50, and other portions of the vehicle 10. The heat generated during braking thus results in a thermal gradient within the braking assembly 50.

The example braking assembly 50 uses these thermal differences to generate power. The power can be used, for example, to power the tire pressure monitoring sensors 26 instead of, or in addition to, batteries. The power could also be used to supplement charge of the battery 38.

Figure 5:
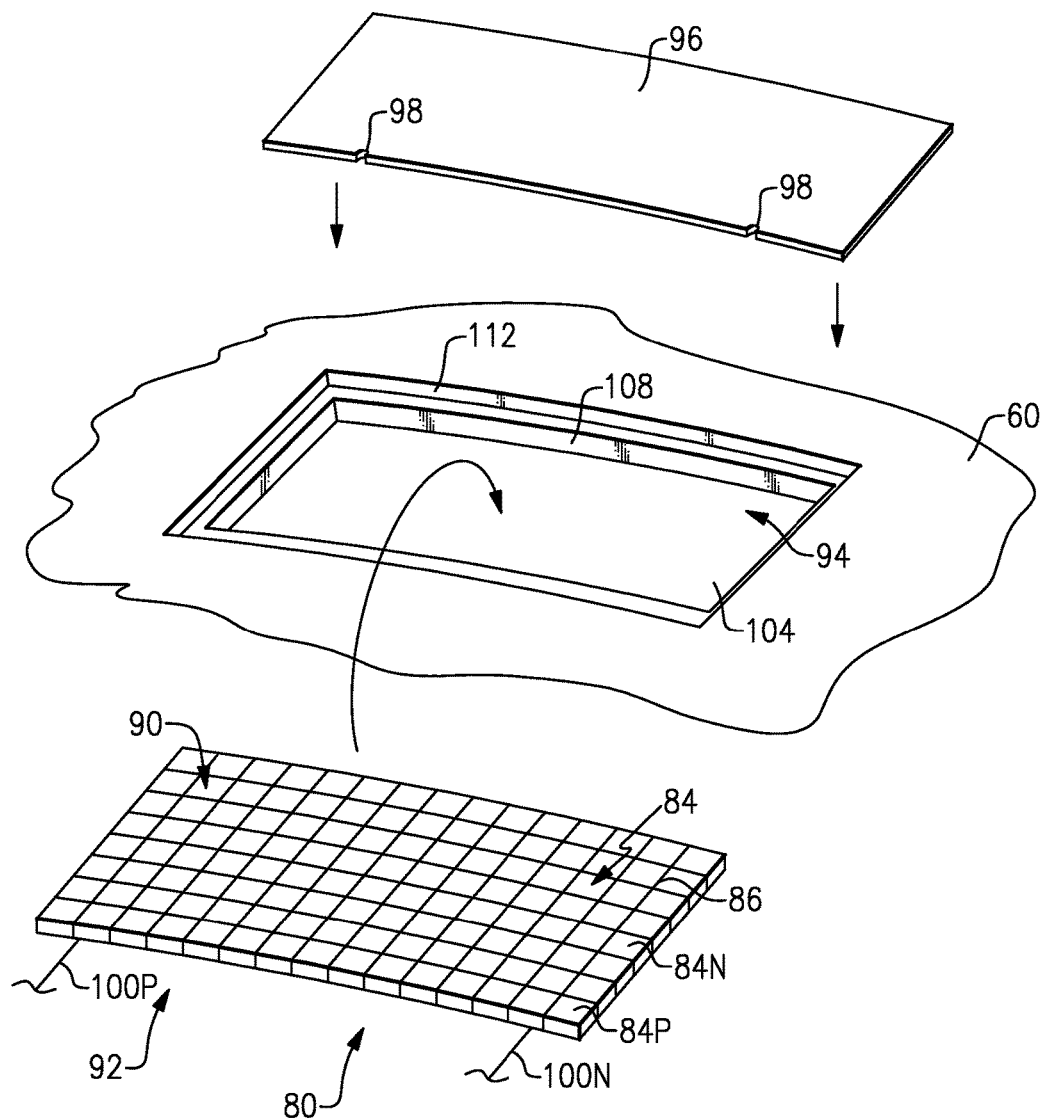
FIG. 5 shows a close-up and exploded view of a portion of the braking assembly of FIG. 4.

Referring now to FIG. 5 with continuing reference to FIGS. 1 to 4, the braking assembly 50 incorporates a thermoelectric generator device 80 to convert temperature differences in areas of the braking assembly 50 into electrical power.

The example thermoelectric generator device 80 comprises an integrated thermoelectric array 84 of a plurality of semiconductor pellets. Some of the semiconductor pellets 84n are n-type semiconductor pellets. Some of the semiconductor pellets 84p are p-type semiconductor pellets. The n-type semiconductor pellets 84n and the p-type semiconductor pellets 84p are arranged in a checkerboard-type fashion within the array 84. Conductor tabs 86 conductively link the pellets within the array 84 of the device 80.

The array 84 can harvest energy by generating power when a temperature on a first side 90 of the array 84 is different than a temperature on a second side 92 of the array 84. In this example, the thermoelectric generator device 80 utilizes the Seebeck effect to generate power in response to the temperature difference between the first side 90 and the second side 92. A person having skill in this art and the benefit of this disclosure would understand how to generate power in response to a temperature difference.

The example array 84 is housed within a cavity 94 provided by the actuator 60. The actuator 60 may be cast in a way to provide the cavity 94. As the example array 84 is housed within the cavity 94 provide by the actuator 60, the example array 84 is housed outside the brake pad 54. Notably, since the array 84 is housed outside the brake pad 54, the brake pad 54 can be replaced without substantially disturbing the array 84.

To secure the array 84, the array 84 is placed into the cavity 94. A cover 96 of the actuator 60 is then secured over the cavity 94 to hold the array 84 within the cavity 94. The cover 96 includes access holes 98 that permit a positive lead 100p and a negative lead 100n to connect to the array 84 within the cavity 94 when the cover 96 is secured. The leads 100p and 100n communicate power from the array 84. In other examples, the cover 96 is omitted, and the array 84 is adhesively secured to the actuator 60. The cover 96 could also be bonded to the actuator 60 via welding, sintering, or discrete fasteners, etc. instead of adhesive.

The cavity 94 has a floor 104, sidewalls 108, and a groove 112. The sidewalls 108 extend from the floor 104 to the groove 112. The height of the sidewalls 108 corresponds generally to a height of the array 84. When the array 84 is positioned within the cavity 94, the cover 96 can then be fitted within the groove 112. Fitting the cover 96 within the groove 112 enables the actuator 60 to have a relatively smooth and uninterrupted outwardly facing surface when the cover 96 is secured. The array 84 is contained and encapsulated within the cavity 94 when the cover 96 is secured.

Notably, the floor 104 is positioned closer to the brake pad 54 than the cover 96. When the brake pad 54 contacts the rotor 58 during operation, the generated heat causes the floor 104 to heat more than the cover 96. Accordingly, the second side 92 of the array 84, which is in contact with the floor 104, heats more than the first side 90 of the array, which is in contact with the cover 96. A temperature gradient is thus created between the first side 90 and the second side 92 of the array. The array 84 uses this temperature gradient to generate power, which is then supplied via the leads 100p and 100n to a desired location, such as the tire pressure monitoring sensors 26 or the accessory battery 38.

Figure 6A:
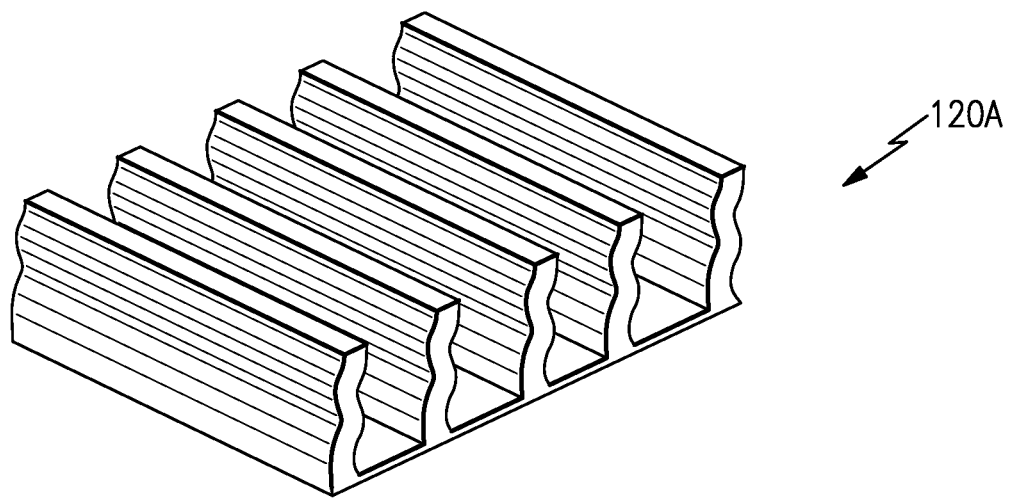
FIG. 6A shows an example heat sink structure for use in the braking assembly of FIG. 2.
Figure 6B:
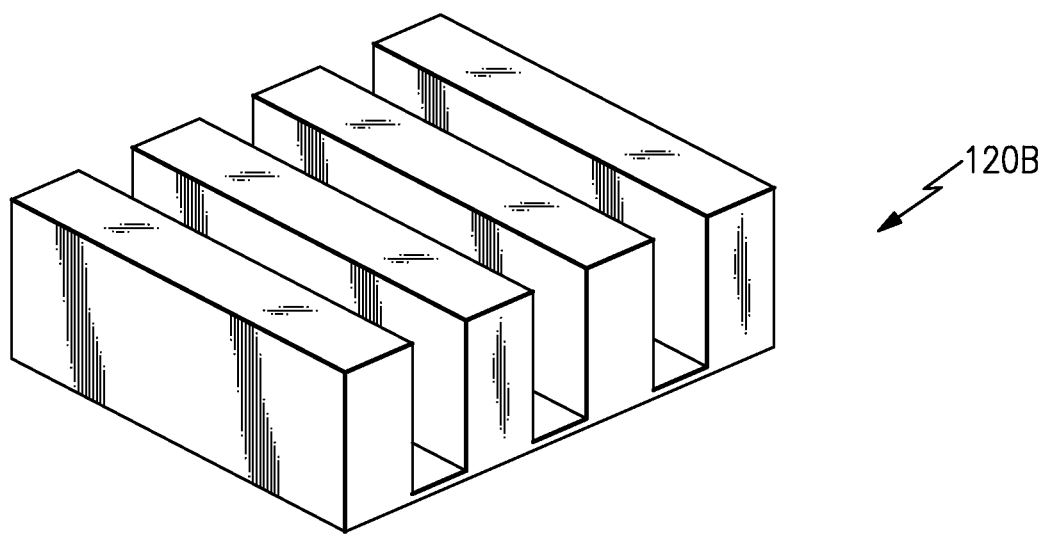
FIG. 6B shows another example heat sink structure for use in the braking assembly of FIG. 2.

In some examples, the cover 96 may be equipped with a heat sink structure 120A (FIG. 6A) or a heat sink structure 120B (FIG. 6B). The heat sink structures 120A and 120B facilitate transfer of thermal energy to ambient air, which cools the cover 96 relative to a cover 96 lacking a heat sink structure. Cooling the cover 96 with a heat sink structure can provide a cooling effect to the cover 96 and thereby increase the temperature difference between the cover 96 and the floor 104 of the cavity 94. Increasing the temperature difference may increase power generated by the thermoelectric generator device 80. Thus, heat transfer from the floor 104, which is relatively hot, through the second side 92, which is relatively cool, is enhanced via the heat sink structure 120A or 120B.

In this example, the thermoelectric generator device 80 is positioned and housed within the actuator 60. Positioning the thermoelectric generator device in the actuator 60 spaced from the brake pad 54 ensures that brake pad 54 can be replaced and repaired without significantly disturbing or requiring replacement of the thermoelectric generator device 80.

In this embodiment, the actuator 60 provides the areas adjacent both the first side 90 and the second side 92 of the thermoelectric generator device 80.

In another embodiment, an area of the actuator 60 may be adjacent the first side 90 and the second side 92 of the thermoelectric generator device 80 may be adjacent another area of the brake assembly, such as the cavity 74, or ambient air.

Typically, in such an embodiment, the second side 92 adjacent the cavity 74 is cool relative to the first side 90 adjacent to the actuator 60. The brake fluid from the brake fluid supply 72 causes the second side 92 adjacent the cavity 74 to exhibit this temperature difference. The thermal gradient between the first side 90 adjacent the actuator 60 and the second side 92 adjacent the cavity 74 provides the thermal gradient enabling the thermoelectric generator device 80 to generate electrical power.

Features of some of the disclosed examples include integration of a thermoelectric generator device into an actuator, which can protect the active elements of the thermoelectric generator from harsh ambient conditions (e.g. dirt, brake dust, water, salt, etc.). Housing and integrating the thermoelectric generator device into the actuator can desirably protect the active elements of the thermoelectric generator from harsh ambient conditions (e.g. dirt, brake dust, water, salt, etc.)

Other features of some of the disclosed examples include the elimination of limited life battery sources powering sensors of a tire pressure monitoring system, RF transmitter elements of a tire pressure monitoring system, or both. The sensors and RF transmitter elements are instead, or additionally, powered by energy harvested using the thermoelectric generator device. The power to the sensors and RF transmitters may be achieved via wireless power transfer.

In some embodiments, implementation of the disclosed examples can eliminate a wheel speed sensor wire harness at each wheel and provides a level of tire pressure monitoring system functionality for a life of a vehicle without need for discrete limited life battery power sources required for direct tire pressure monitoring systems. Elimination of wheel speed sensor wiring harnesses to centralized controllers for tire pressure monitoring systems can desirably improve reliability and reduce costs.

Large vehicle and trailer towing embodiments can include continuous or discontinuous tire pressure monitoring systems with signal repeaters. These systems may communicate at least partially via RF communications. These embodiments, and other embodiments, can benefit from the features of this disclosure.

For example, the power generated from the thermoelectric generator device associated with a braking assembly can, in some examples, eliminate wiring harnesses connecting a power source at front of a large vehicle (or in a towing vehicle) to one or more tire pressure monitoring system signal repeaters placed at a rear of the large vehicle (or on a trailer).

Further, the power generated from the braking assembly can, in some examples, eliminate the need for discrete limited-life local battery power source in the tire pressure monitoring system repeaters, or can provide for a discontinuous alternative power source, which improves life of the included primary or rechargeable battery power source in the tire pressure monitoring system repeaters.

Thermoelectric elements in the braking assemblies associated with one or more wheels at rear of vehicle or on trailer can provide the power to the tire pressure monitoring system signal repeaters.

Eliminating, or reducing required, wiring harnesses and discrete local battery power sources can improve system reliability, eliminate service/part costs associated with battery-only-powered tire pressure monitoring system repeater unit battery failures, and can further provide weight and cost reductions in these vehicle applications.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A brake assembly, comprising:
a brake pad;
an actuator that selectively moves the brake pad to contact a rotor; and
a thermoelectric generator device housed within a cavity of the actuator, the thermoelectric generator device generating power in response to a temperature difference within the brake assembly.

2. The brake assembly of claim 1, wherein the actuator is a caliper.

3. The brake assembly of claim 1, wherein the brake pad comprises a pad body secured to a pad backing plate.

4. The brake assembly of claim 1, wherein the thermoelectric generator device comprises an integrated thermoelectric array.

5. The vehicle of claim 1, further comprising a tire pressure monitoring system at least partially powered by power from the thermoelectric generator device.

6. A brake assembly, comprising:
a brake pad;
an actuator that selectively moves the brake pad to contact a rotor; and
a thermoelectric generator device that generates power in response to a temperature difference between a first area and a second area, the thermoelectric generator device housed outside of the brake pad within an enclosed cavity.

7. The brake assembly of claim 6, wherein the first area is an area of the actuator, and the second area includes a cover secured to the actuator to enclose the thermoelectric generator device within the enclosed cavity.

8. The brake assembly of claim 6, wherein the first area is an area of the actuator, and the second area includes a fluid.

9. A power generating method, comprising:
selectively moving a brake pad against a rotor using an actuator; and
generating power using a thermoelectric generator device housed within an enclosed cavity of the actuator and spaced from the brake pad.

10. The method of claim 9, powering a tire pressure monitoring system with the power.

11. The method of claim 9, charging a battery of a vehicle with the power.

12. The method of claim 9, wherein the actuator is a caliper, the thermoelectric generator device generates power using a temperature difference between a first, relatively hot portion of the caliper and a second, relatively cold portion of the caliper, wherein the second, relatively cold portion includes a cover that encloses the thermoelectric generator device within the cavity.

13. The method of claim 9, wherein the thermoelectric generator device generates power using a temperature difference between a portion of the actuator and a brake fluid.

14. The brake assembly of claim 1, further comprising a cover that encloses the thermoelectric generator device within the cavity.

15. The brake assembly of claim 14, wherein the actuator includes a floor, sidewalls, and a groove to provide the cavity, wherein the cover is situated within the groove to enclose the thermoelectric generator device such that an outwardly facing surface of the actuator and an outwardly facing surface of the cover together provide a relatively smooth and uninterrupted outwardly facing surface.

16. The brake assembly of claim 14, wherein the cover provides access holes to permit leads to extend from outside the cavity to inside the cavity to connect with the thermoelectric generator device.

17. The brake assembly of claim 14, further comprising a heat sink structure portion of the cover, the heat sink structure including a plurality of extensions extending away from the cavity when the cover encloses the thermoelectric generator device within the cavity.

18. The brake assembly of claim 6, further comprising a cover securable to the actuator to enclose the thermoelectric generator device within the enclosed cavity, the cover including a heat seat structure with a plurality of protrusions that extend away from the enclosed cavity when the cover is secured to the actuator.

19. The brake assembly of claim 6, further comprising a cover securable to the actuator to enclose the thermoelectric generator device within the enclosed cavity, the cover configured to fit within a groove provided by the actuator such that the outwardly facing surface of the cover and the outwardly facing surface of the actuator provide a relatively smooth and uninterrupted surface.

* * * * *